US010996709B2

(12) United States Patent
Shamanna et al.

(10) Patent No.: US 10,996,709 B2
(45) Date of Patent: May 4, 2021

(54) LOW POWER CLOCK GATE CIRCUIT

(71) Applicant: Intel Corporation, Santa Clara, CA (US)

(72) Inventors: Gururaj Shamanna, Austin, TX (US); Mitesh Goyal, Bangalore (IN); Jagadeesh Chandra Salaka, Bengaluru (IN); Purna C. Nayak, Bangalore (IN); Abhishek Sharma, Noida (IN); Harishankar Sahu, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/557,860

(22) Filed: Aug. 30, 2019

(65) Prior Publication Data

US 2021/0064076 A1 Mar. 4, 2021

(51) Int. Cl.
| | |
|---|---|
| *H03K 3/012* | (2006.01) |
| *H03K 19/00* | (2006.01) |
| *G06F 1/12* | (2006.01) |
| *H03K 3/037* | (2006.01) |
| *H03K 19/20* | (2006.01) |

(52) U.S. Cl.
CPC ............... *G06F 1/12* (2013.01); *H03K 3/012* (2013.01); *H03K 3/037* (2013.01); *H03K 19/0016* (2013.01); *H03K 19/20* (2013.01)

(58) Field of Classification Search
CPC .. H03K 3/012; H03K 3/037; H03K 3/356086; H03K 3/356095; H03K 3/356182; H03K 3/356191; H03K 19/0013; H03K 19/0016
See application file for complete search history.

(56) References Cited

U.S. PATENT DOCUMENTS

| | | | |
|---|---|---|---|
| 6,204,695 B1 | 3/2001 | Alfke et al. | |
| 8,030,982 B2* | 10/2011 | Datta | H03K 19/0013 |
| | | | 327/291 |
| 9,362,910 B2* | 6/2016 | Gurumurthy | H03K 19/0016 |
| 9,577,635 B2* | 2/2017 | Rasouli | H03K 19/0016 |
| 10,177,765 B2* | 1/2019 | Hsu | H03K 19/0013 |
| 10,298,235 B2 | 5/2019 | Lim et al. | |
| 10,461,747 B2* | 10/2019 | Venugopal | H03K 5/134 |
| 10,491,217 B2* | 11/2019 | Hsu | H03K 19/0016 |
| 2008/0129359 A1 | 6/2008 | Lee et al. | |
| 2015/0155870 A1 | 6/2015 | Gururajarao | |
| 2019/0044511 A1 | 2/2019 | Hsu et al. | |

FOREIGN PATENT DOCUMENTS

KR 20180111502 10/2018

OTHER PUBLICATIONS

International Search Report and Written Opinion from PCT/US2020/043915 dated Nov. 16, 2020, 11 pgs.

* cited by examiner

*Primary Examiner* — Patrick O Neill
(74) *Attorney, Agent, or Firm* — Green, Howard & Mughal LLP

(57) ABSTRACT

A clock gate circuit (CGC) is described that optimizes dynamic power of the CGC when clock is gated. The CGC helps in dynamic power reduction of clock network by offering lower clock pin capacitance and also by providing clock pin driver downsizing opportunities. Switching power, and hence, dynamic power is reduced when load on the input clock pin is reduced. Further, dynamic power of the clock network also reduces by downsizing the clock buffers, which drive the CGC clock pins.

20 Claims, 12 Drawing Sheets

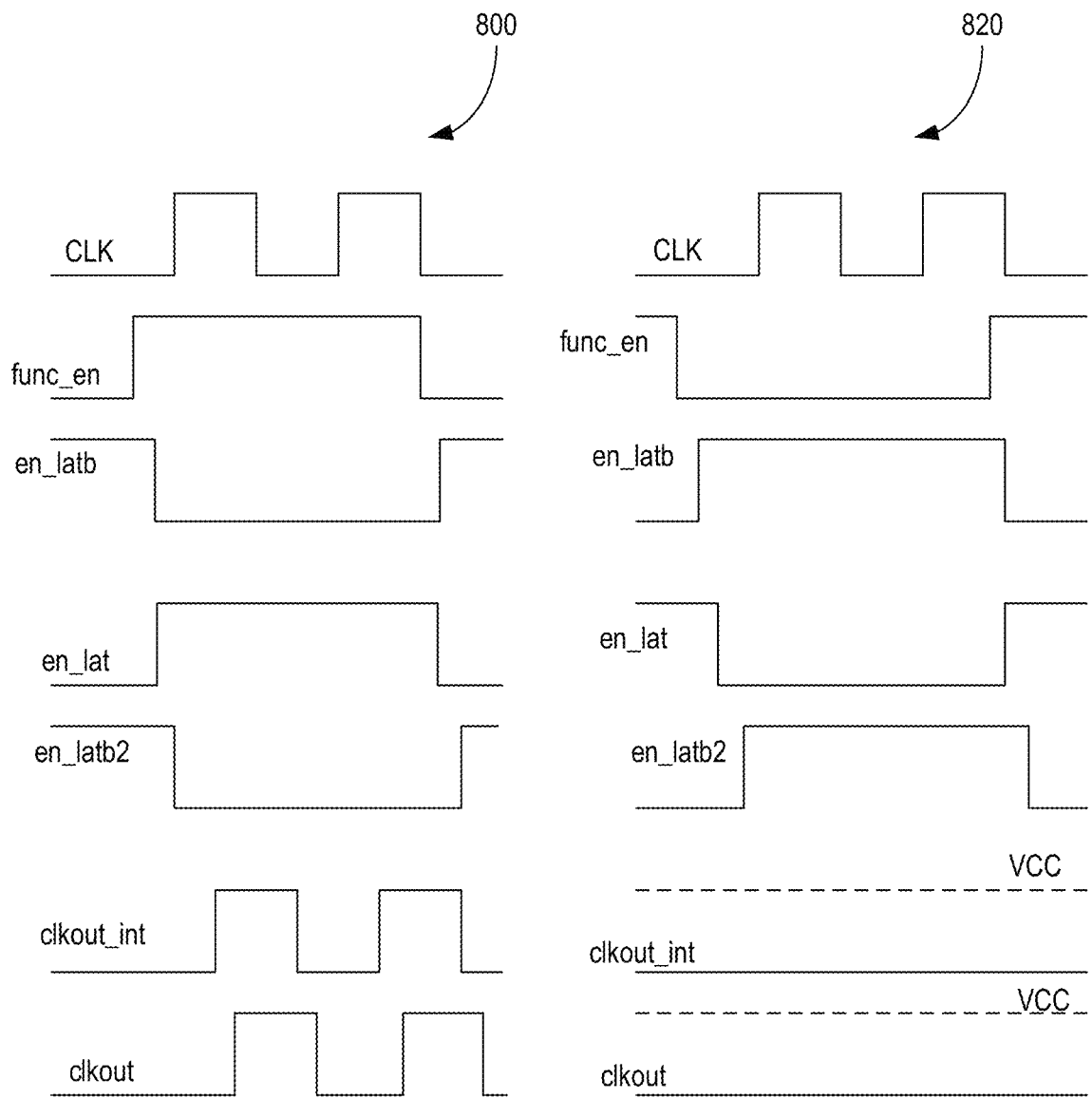

LOW POWER CLOCK GATE CIRCUIT

BACKGROUND

Processors such as system-on-chip (SoC) use Clock Gating Cells (CGC) to minimize dynamic power in idle (standby) or low power states. A CGC cell reduces processors' dynamic power by preventing clock from propagating to downstream clock distribution network and sequential stages. Clock gating cells themselves consume power in the process of suppressing output clock. This power adds to the total power consumption of the processor.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8A illustrates a plot that shows signal transition sequence when func_en is logic high, in accordance with some embodiments.

FIG. 8B illustrates a plot that shows signal transition sequence when func_en is logic low, in accordance with some embodiments.

DETAILED DESCRIPTION

Figure 1A:
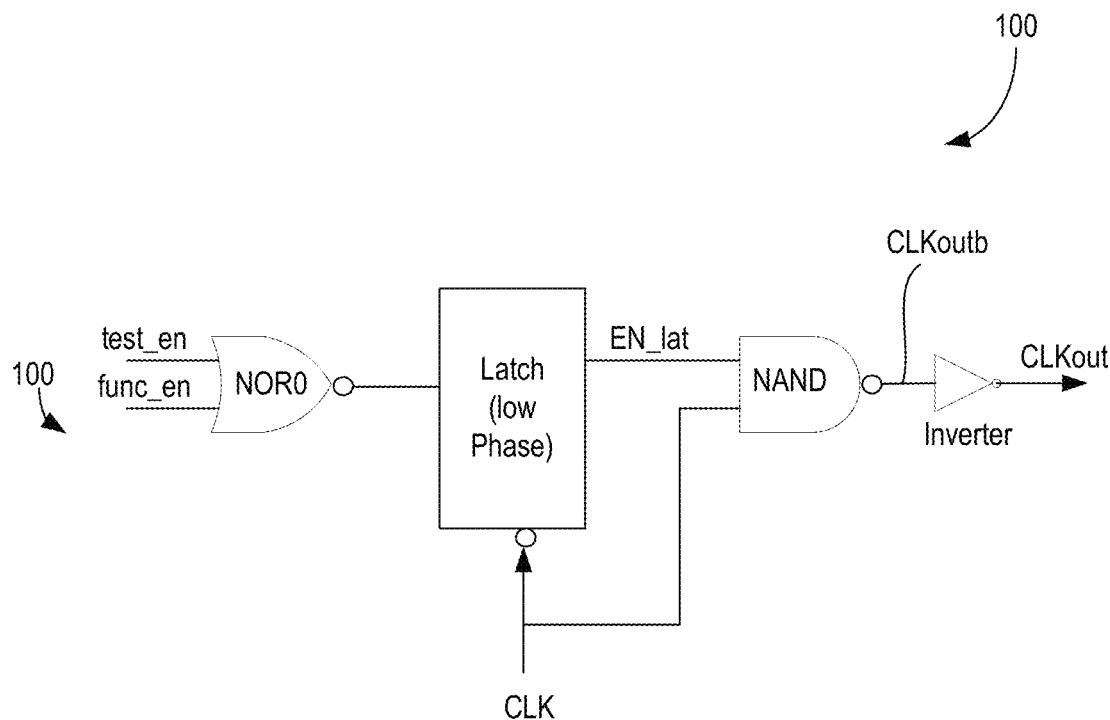
FIG. 1A illustrates a clock gate cell (CGC).

Some embodiments describe a novel CGC circuit topology that optimizes dynamic power of the CGC when clock is gated. The clock gate circuit of some embodiments helps in dynamic power reduction of clock network by offering lower clock pin capacitance and also by providing clock pin driver downsizing opportunities. Switching power, and hence, dynamic power is reduced when load on the input clock pin is reduced. Further, dynamic power of the clock network also reduces by downsizing the clock buffers, which drive the CGC clock pins.

There are many technical effects of various embodiments. For example, circuit topology of some embodiments reduces dynamic power (e.g., by 30%) compared to conventional clock gate circuits. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1B:
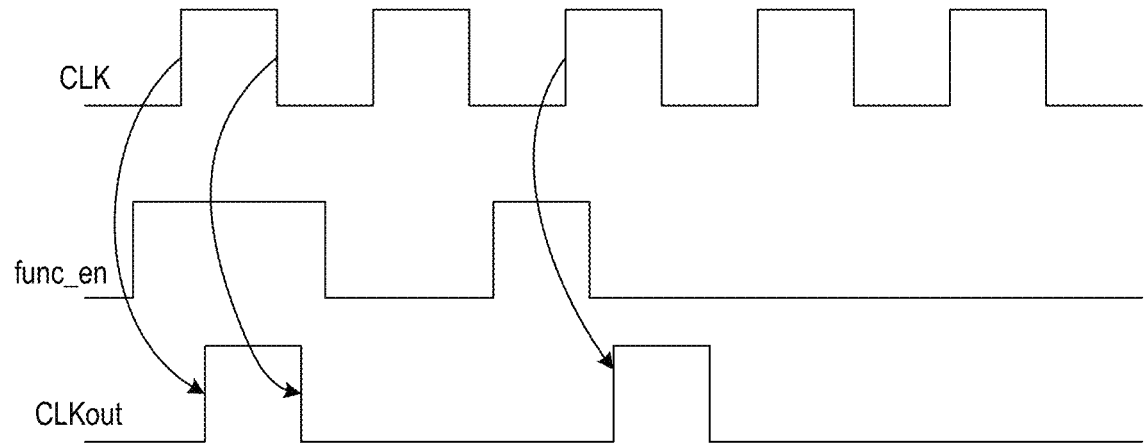
FIG. 1B illustrates a timing diagram of the CGC of FIG. 1A.

FIG. 1A illustrates clock gate cell (CGC) 100. A typical clock gating cell consists of a low phase latch followed by an AND gate shown as a combination of NAND gate (NAND0) and an inverter. FIG. 1B illustrates timing diagram 120 of CGC 100 of FIG. 1A. Clock (CLK) is propagated to the output (CLKout), if enable signal (en) is high ('1) during high phase of CLK. A low phase latch (e.g., transparent during low phase CLK) is used to ensure that en signal is held high for the entire high phase of clock. In the absence of a low phase latch, duty cycle of CLKout signal can vary significantly and may cause functional failures.

The low phase latch has two enable signals as inputs (which are mutually exclusive) as functional enable (func_en) signal and test enable (test_en). Func_en toggles when SoC or processor is operating in functional mode while test_en signal toggles during scan or other test modes. Test enable signal is usually held high ('1) in scan shift/capture mode to enable scan patterns propagate to downstream logic. It should be noted that the two enable signals are mutually exclusive and both enable signals need to meet setup/hold time of latch to ensure either clock gating or clock propagation.

Figure 2A:
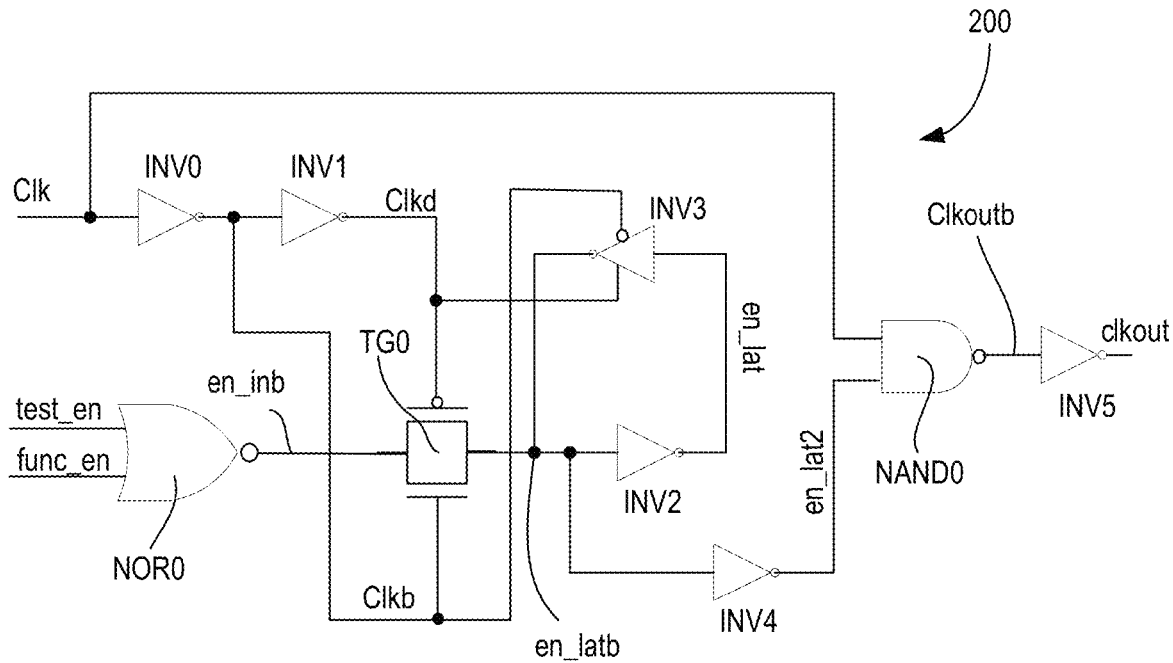
FIG. 2A illustrates a CGC (B01).

FIG. 2A illustrates CGC (B01) 200. FIG. 2A illustrates a transistor level representation of the CGC (here also referred to as B01 CGC). B01 CGC consists of NOR gate NOR0, transmission gate (TG0), inverters INV0, INV1, INV2, INV3, INV4, and INV5, NAND gate NAND0, input clock node Clk, input enable nodes test_en and func_en, and output node clkout coupled together as shown. Here, inverter INV3 is a tristateable inverter, which is controllable by Clkd and Clkb. The output of NOR gate NOR0 is en_inb. Transmission gate TG0 is controllable by Clkd and Clkb signals. The output of transmission gate TG0 is enab_latb. The output of inverter INV2 is en_lat. The output of inverter INV4 is en_lat2. The output of NAND0 is Clkoutb. The output of inverter INV5 is clkout.

As mentioned previously, Clkout mirrors behavior of CLK signal, if either func_en or test_en signals is high, before rising edge of Clk signal. Output signal, Clkout is gated (e.g., remains low) if one or both enable signals are low, before rising edge of Clk signal. B01 CGC topology 200 has the lowest set-up time requirement among existing CGC topologies because inverters INV0 and INV1 delay closing of transmission gate (TG0). However, B01 CGC topology 200 is sub-optimal since capacitance of ten transistors (two in inverter INV0, two in inverter INV1, two in transmission gate TG0, two in inverter INV3 and two in NAND gate NAND0) switch on every clock transition, even if func_en is low.

Figure 2B:
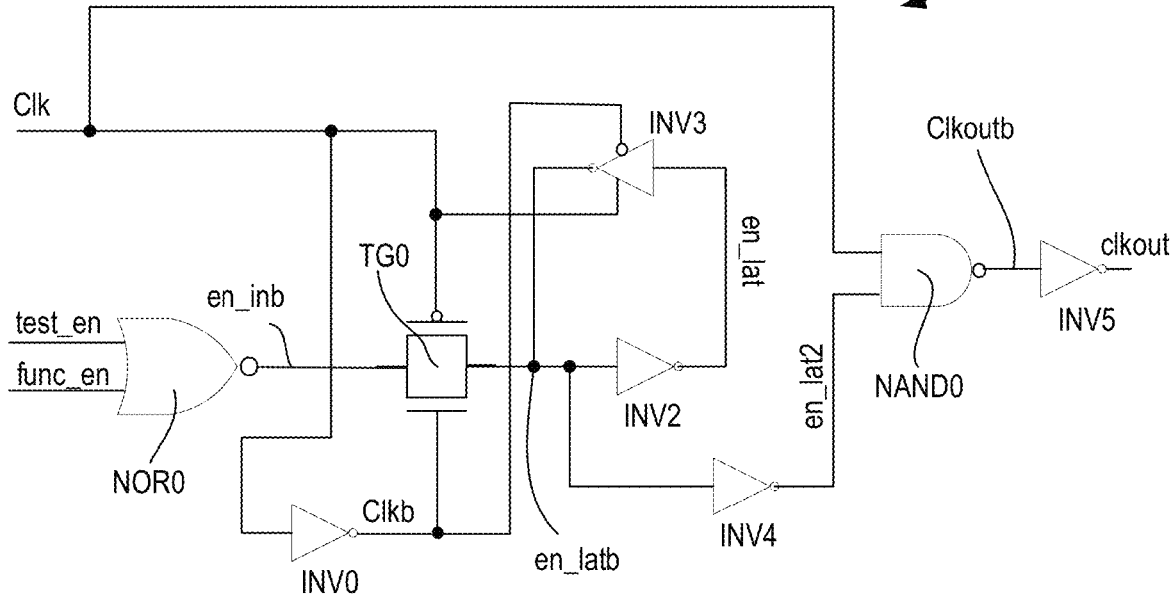
FIG. 2B illustrates a CGC (B05).

FIG. 2B illustrates CGC (B05) 220 which is a transistor-level representation of another commonly used CGC (herein also referred to as B05 CGC). B05 CGC 220 topology has higher set-up time compared to B01 CGC 200 topology due to the absence of clock inverter INV1. B05 CGC 220 is slightly better than B01 CGC 200 since capacitance of eight transistors (two in inverter INV0, two in transmission gate TG0, two in inverter INV3 and two in NAND gate NAND2) switch on every clock transition, compared to ten transistors in B01 CGC topology 200. Both B01 and B05 CGC topologies consume dynamic power on every single clock transition, even if output clock (clkout) is gated.

Figure 3A:
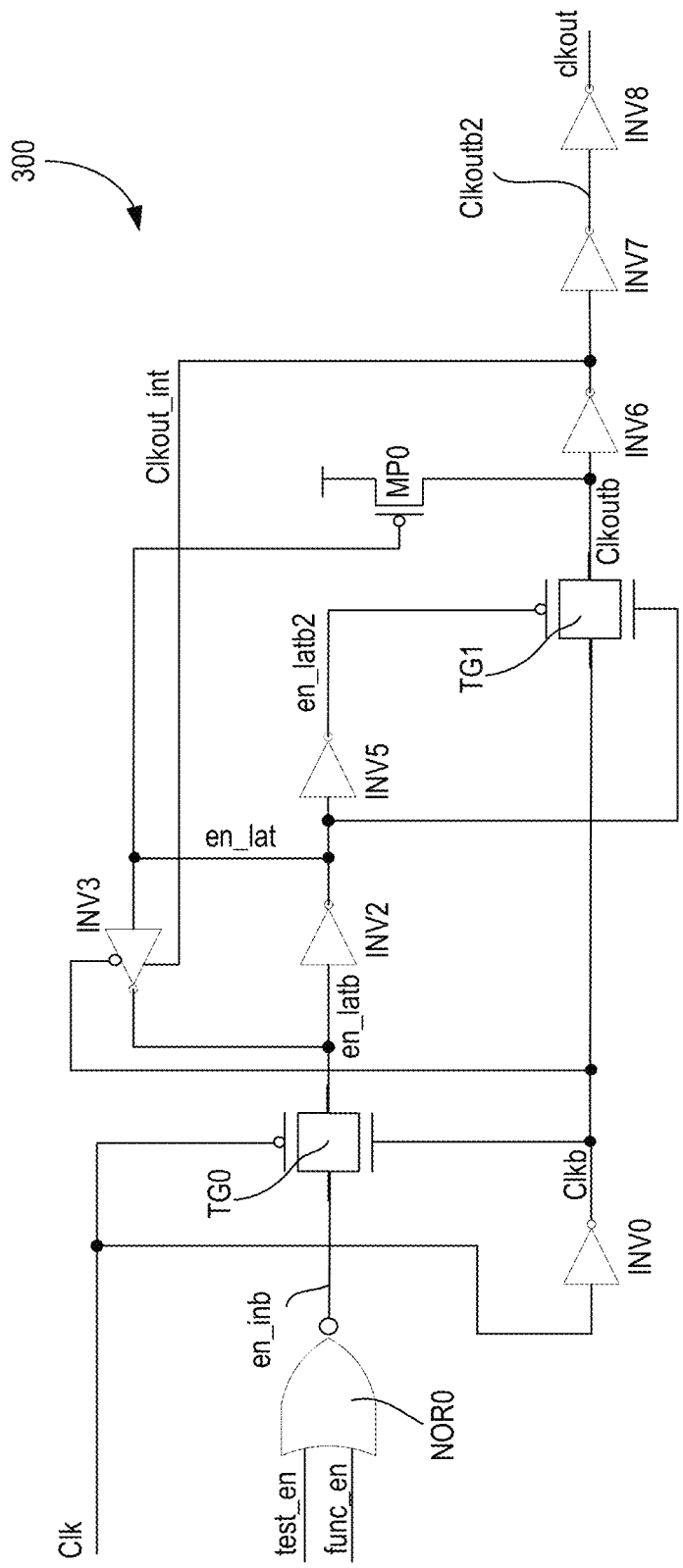
FIG. 3A illustrates a CGC (B09) with p-type keeper, in accordance with some embodiments.

FIG. 3A illustrates CGC (B09) 300 with p-type keeper, in accordance with some embodiments. CGC B09 300 comprises NOR gate NOR0, transmission gates TG0 and TG1, inverters INV0, INV2, INV3, INV5, INV6, INV7, and INV8; pull-up device MP0, input nodes or pins clock Clk, enable signals test_en and func_en, output node or pin clkout, internal nodes en_inb, Clkb, en_latb, en_lat, en_latb2, Clkoutb, Clkout_int, and Clkoutb2 coupled together as shown. Here, inverter INV3 is a tristateable inverter, which is controllable by clocks on clock nodes Clkb and Clkout_int.

Similar to B05/B01 CGC topologies, func_en and test_en signals are latched in low phase of clock. Either func_en or test_en signal should be high to propagate the clock. Unlike B01/B05 CGC, that qualify latched enable signal with clk using an AND gate, B09 CGC 300 uses the latched enable signal (en_lat) to latch input clock signal (Clkb) and generate clkout, in accordance with some embodiments.

In the absence of inverters INV7 and INV8, inverter INV6 drives an external load as well as the n-type in keeper inverter INV3. Inverters INV7 and INV8 can also be used to characterize CGC B09 300 where output pin (or net) is also used internally within the cell. In some embodiments, inverters INV7 and INV8 are removed and inverter INV6 drives both inverter INV3 and the output. In some cases, in the absence of inverters INV7 and INV8, noise from processor may impact keeper inverter's (INV3) ability to retain state. Hence, inverters INV7 and INV8 are added to improve robustness of the circuit. Another advantage of adding inverters INV7 and INV8 is that B09 CGC 300 can be scaled to higher drive strengths without any increase in input Clk pin capacitance.

In some embodiments, p-type keeper (MP0) is used to maintain clkout low ('0) when either func_en or test_en is low. This is because clkoutb (and hence clkout) node floats when func_en is low. The p-type keeper is coupled to a power supply rail. Note, Transmission Gate TG1 is non-transparent or closed when func_en is low. To prevent the floating condition, a p-type half-keeper is used, in accordance with some embodiments. P-type keeper MP0, is controlled by en_lat signal, which has same polarity as func_en (or test_en) signal.

A subtle optimization to reduce clock power in B09 CGC 300 is the choice of control signal used to interrupt the p-type stack of keeper inverter INV3. In a classical latch design, there is zero delay between opening of a PMOS pass gate in TG0 and disabling of an NMOS stack in keeper inverter INV3. However, in B09 CGC, delay exists between opening of PMOS in TG0 and disabling NMOS stack of keeper (INV3). This is because different clock signals are used to control transmission gate TG0 and inverter INV3. In some embodiments, Input clk is used to enable p-type transistor in transmission gate TG0 whereas clkout_int (gated-clock) signal is used to interrupt the p-type transistor in INV3. This additional delay results in contention at en_latb node for a short duration, when clk and func_en signals transitions from high to low. On similar lines when clk rises, transmission gate TG0 closes and en_latb node floats for a short duration (e.g., approximately one inverter delay). This floating scenario exists when the latch node (en_latb) is trying to hold a logic 0 (i.e., func_en=1).

Figure 3B:
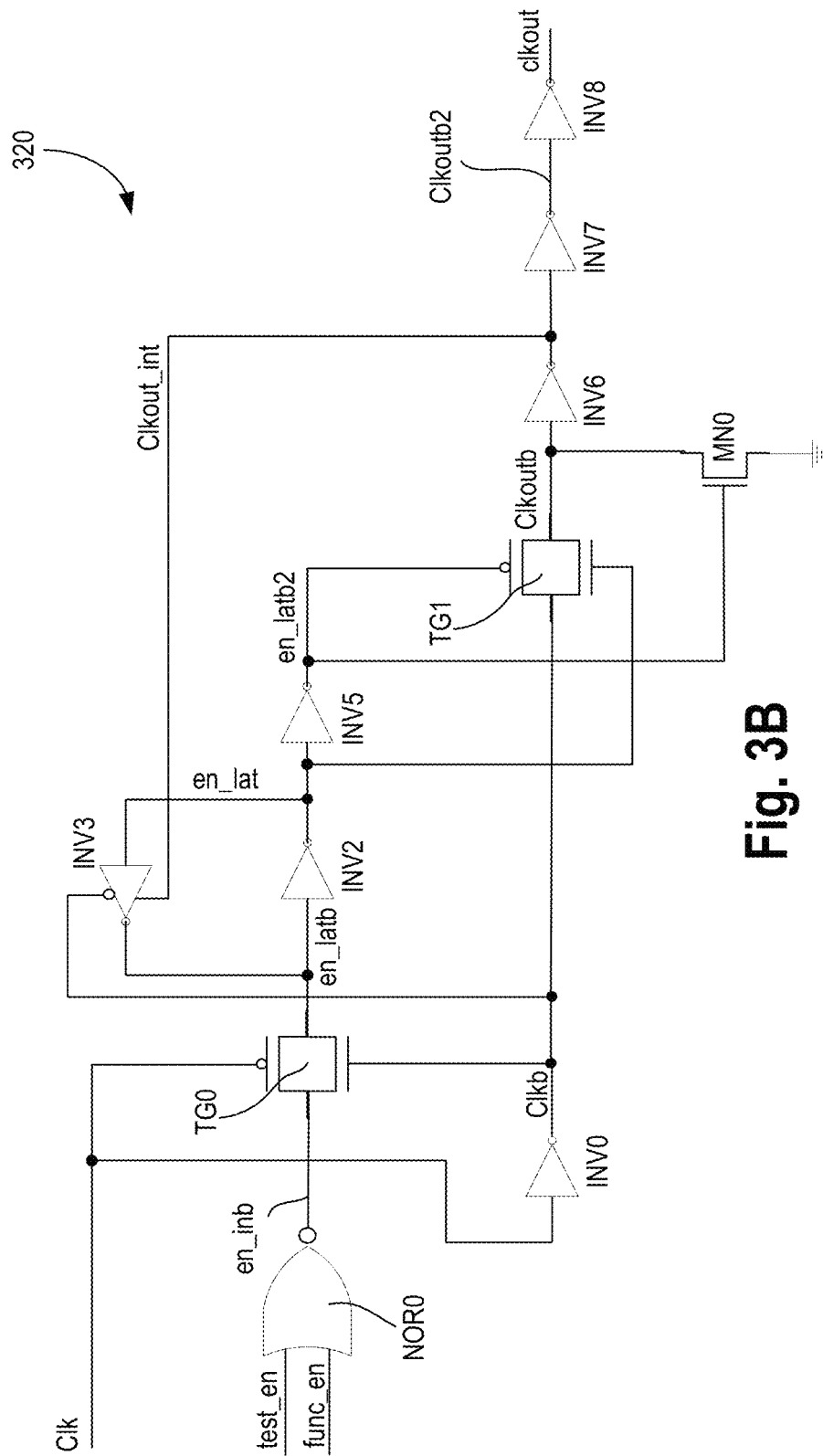
FIG. 3B illustrates a CGC (B09) with n-type keeper, in accordance with some embodiments.

FIG. 3B illustrates CGC (B09) 320 with n-type keeper, in accordance with some embodiments. CGC (B09) 320 is similar to CGC (B09) 300, but for having an n-type keeper MN0. The gate terminal of transistor MN0 is controlled by en_latb2, which is the output of inverter INV5. Drain terminal of transistor MN0 is coupled to Clkoutb while the source terminal of transistor MN0 is coupled to ground. Technical or functional effect wise, CGC 320 behaves same as CGC 300.

Figure 4:
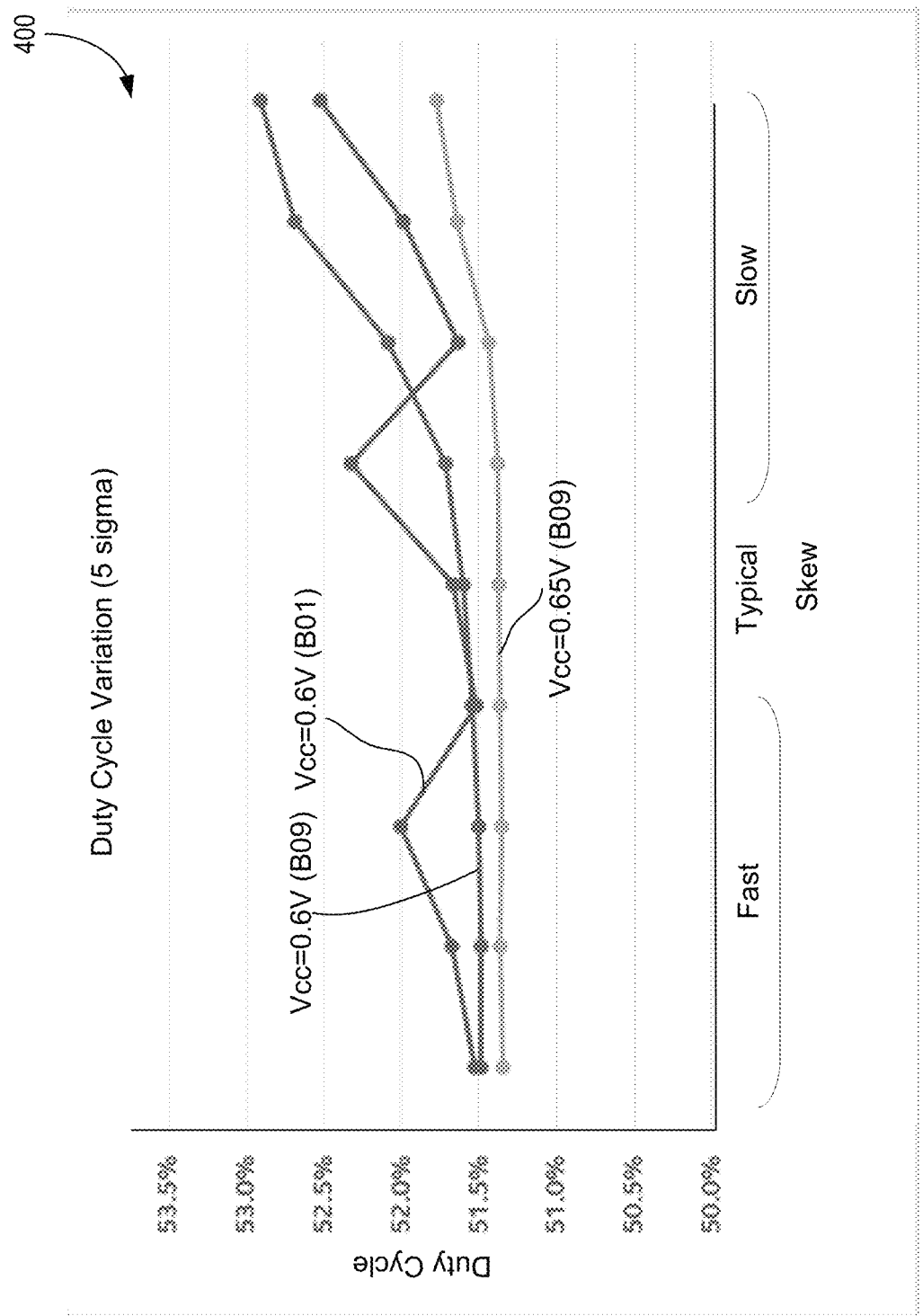
FIG. 4 illustrates a plot showing duty cycle variation at the output of the various CGCs B01 and B09, in accordance with some embodiments.

FIG. 4 illustrates plot 400 with duty cycle variation at the output of the various CGCs B01 and B09, in accordance with some embodiments. Here, x-axis is skew and y-axis is duty cycle in percentage. The simulations show that duty cycle variation (e.g., impact of contention) increases by 1% to 2% across a wide range of process skew corners. It is observed from that B01 CGC has similar duty cycle variation as B09, despite absence of contention in B01 CGC.

Figure 5A:
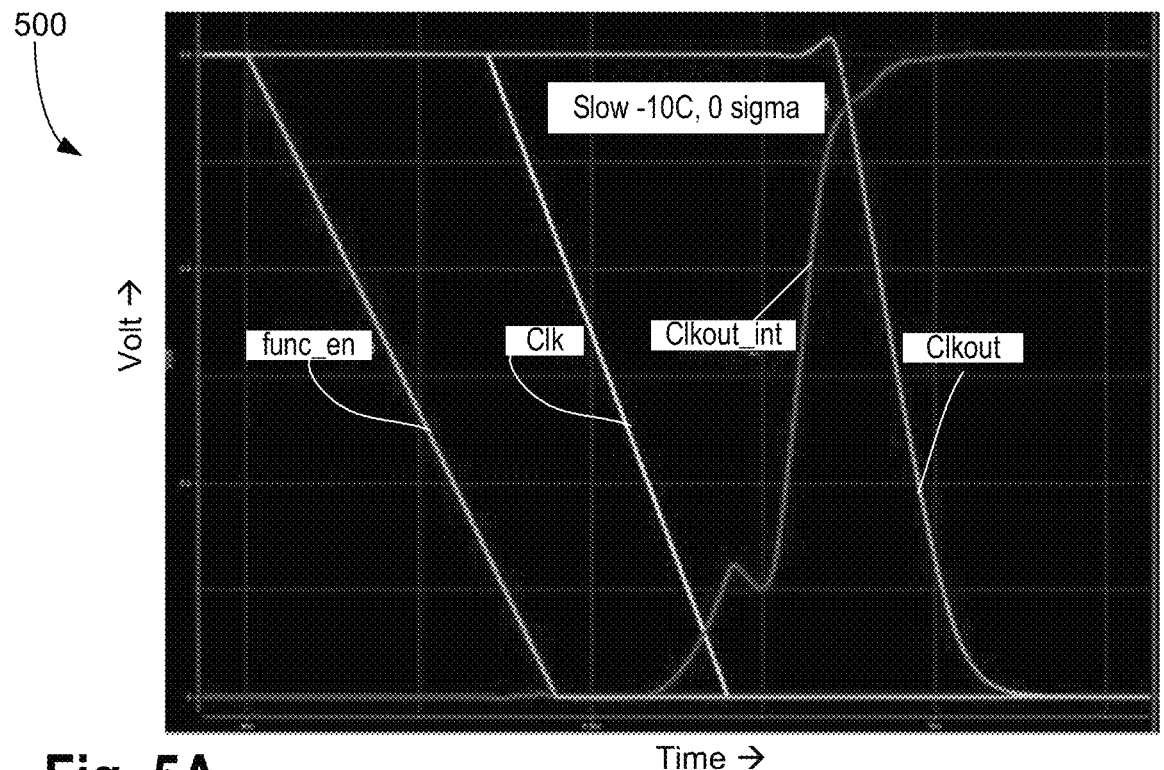
FIGS. 5A-B illustrate plots, respectively, in accordance with some embodiments.
Figure 5B:
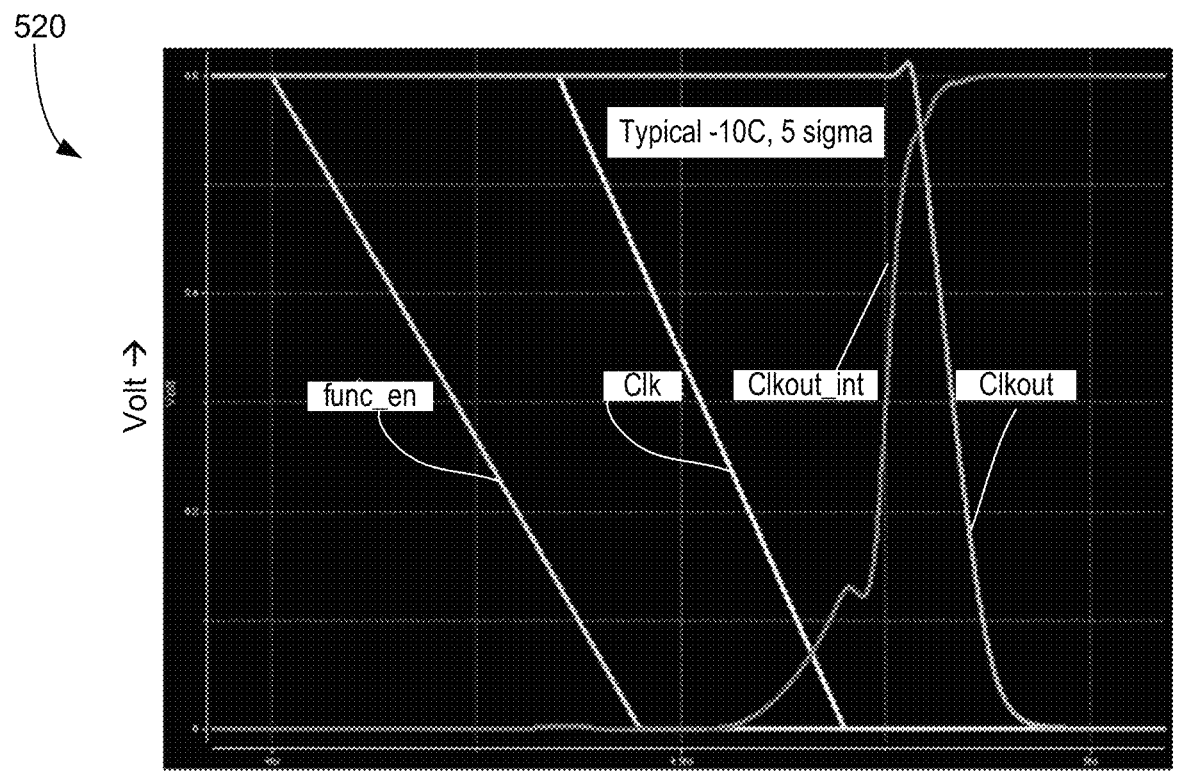
Figure 6A:
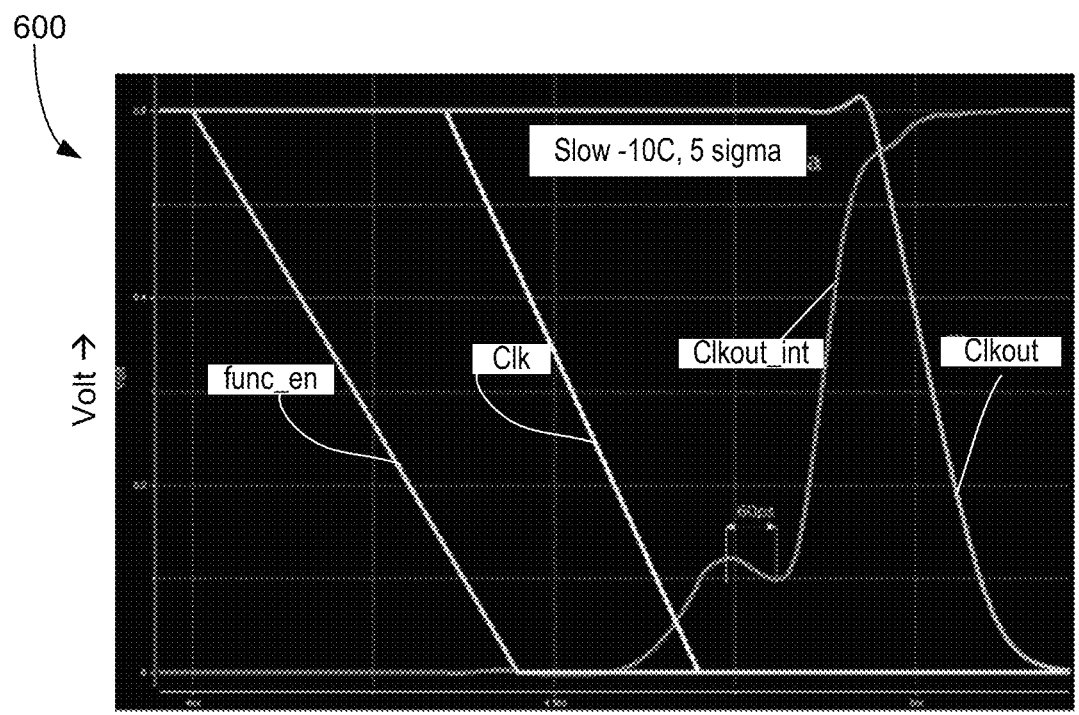
FIGS. 6A-B illustrate plots showing operation of CGC B09, in accordance with some embodiments.
Figure 6B:
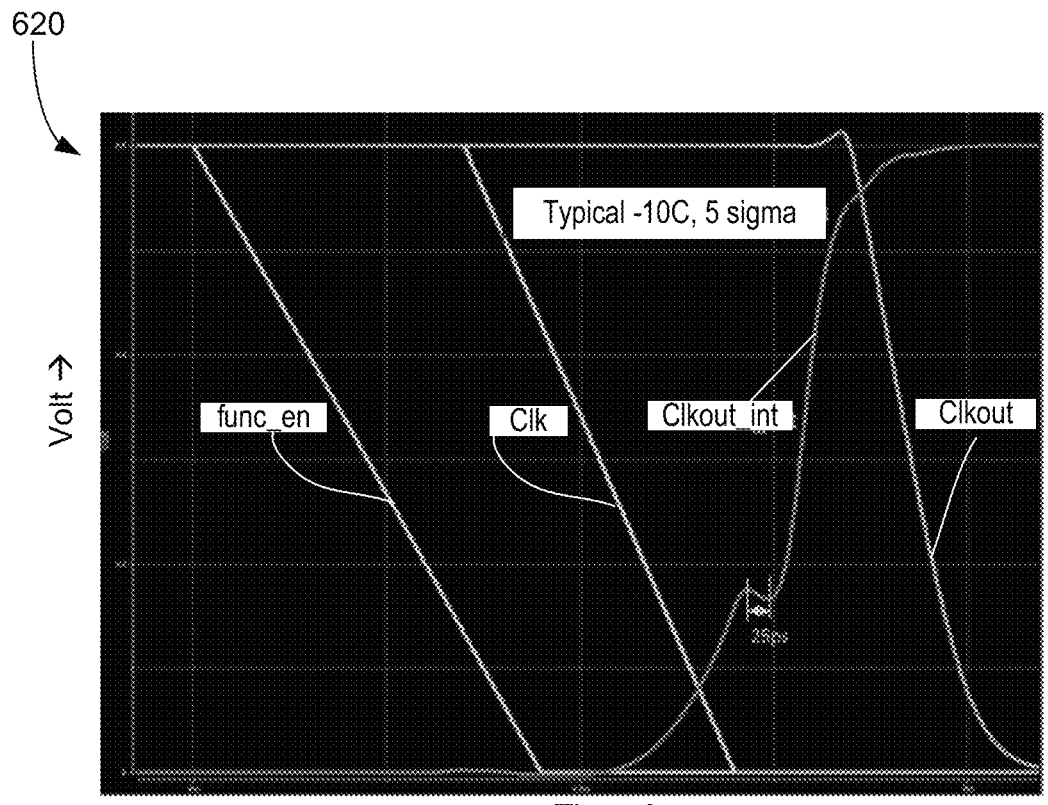

FIGS. 5A-B illustrate plots 500 and 520, respectively. FIGS. 6A-B illustrate plots 600 and 620 showing operation of CGC B09, in accordance with some embodiments. Plots 500, 520, 600, and 620 show contention at en_latb node for a short duration, when clk and func_en signals transitions from high to low. Plots 500, 520, 600, and 620 show magnitude of contention at en_latb node, under zero sigma and five sigma conditions. It is observed from plots 500, 520, 600, and 620 that contention is minimal (e.g., 25 picoseconds (ps)) at typical operating temperatures like 100° C. On similar lines when clk rises, transmission gate TG0 closes and en_latb node floats for a short duration (e.g., approximately one inverter delay). This floating scenario exists when the latch node (en_latb) is trying to hold a logic 0 (i.e., func_en=1). Simulations at 5 sigma across various process skew corners show that the float duration is too small to alter circuit functionality and performance.

Figure 7A:
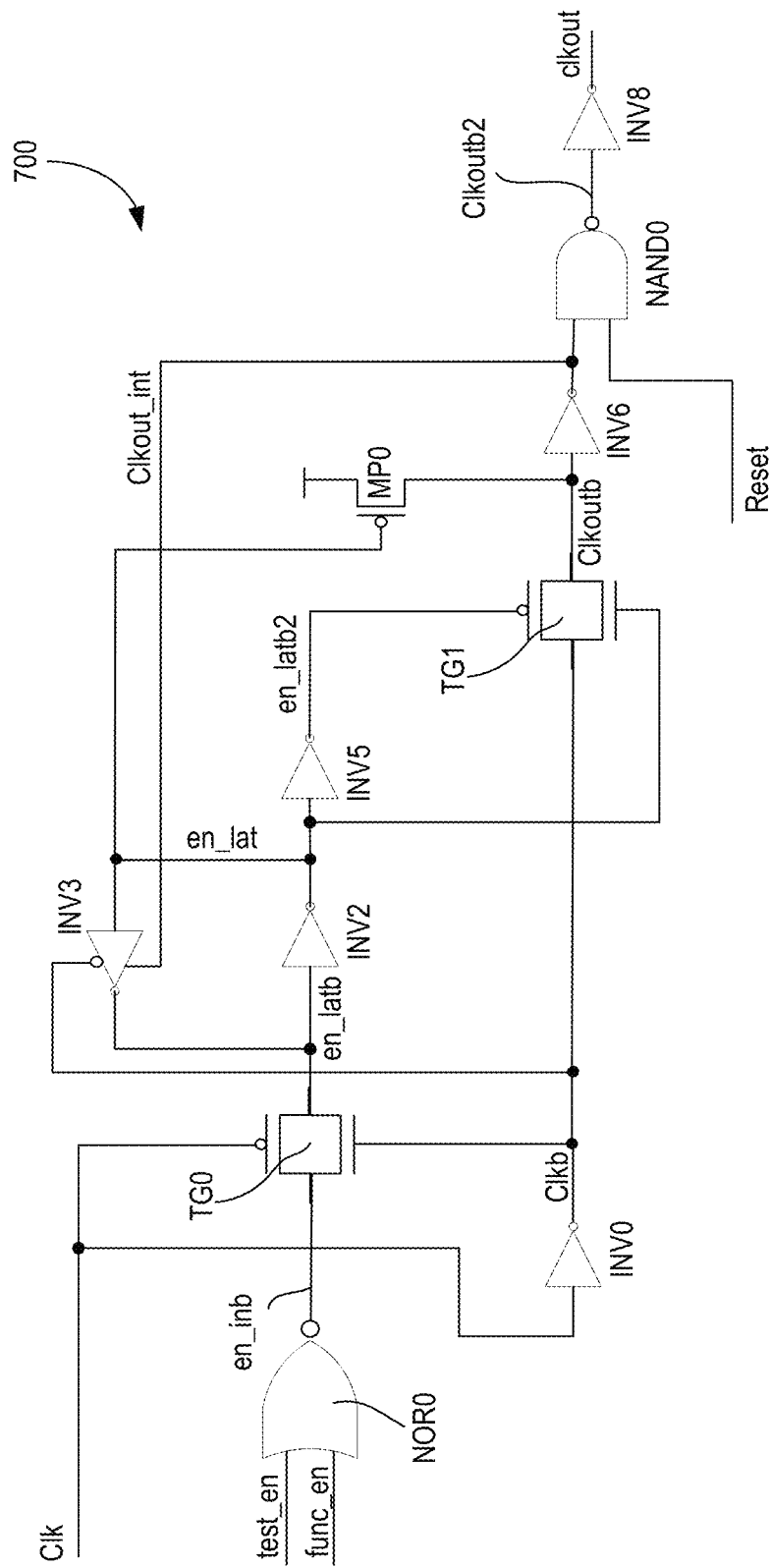
FIG. 7A illustrates a CGC (B09) with reset and p-type keeper, in accordance with some embodiments.

FIG. 7A illustrates CGC (B09) 700 with reset and with p-type keeper, in accordance with some embodiments. CGC 700 is same as CGC 300 but for replacing inverter INV7 with NAND gate NAND0. This configuration allows for reset operation of clkout using Reset signal, which is input to NAND0 gate. A person skilled in the art would appreciate that certain logic gates can be replaced with other logic gates using De-Morgan's Law, without changing the essence of the embodiments.

Figure 7B:
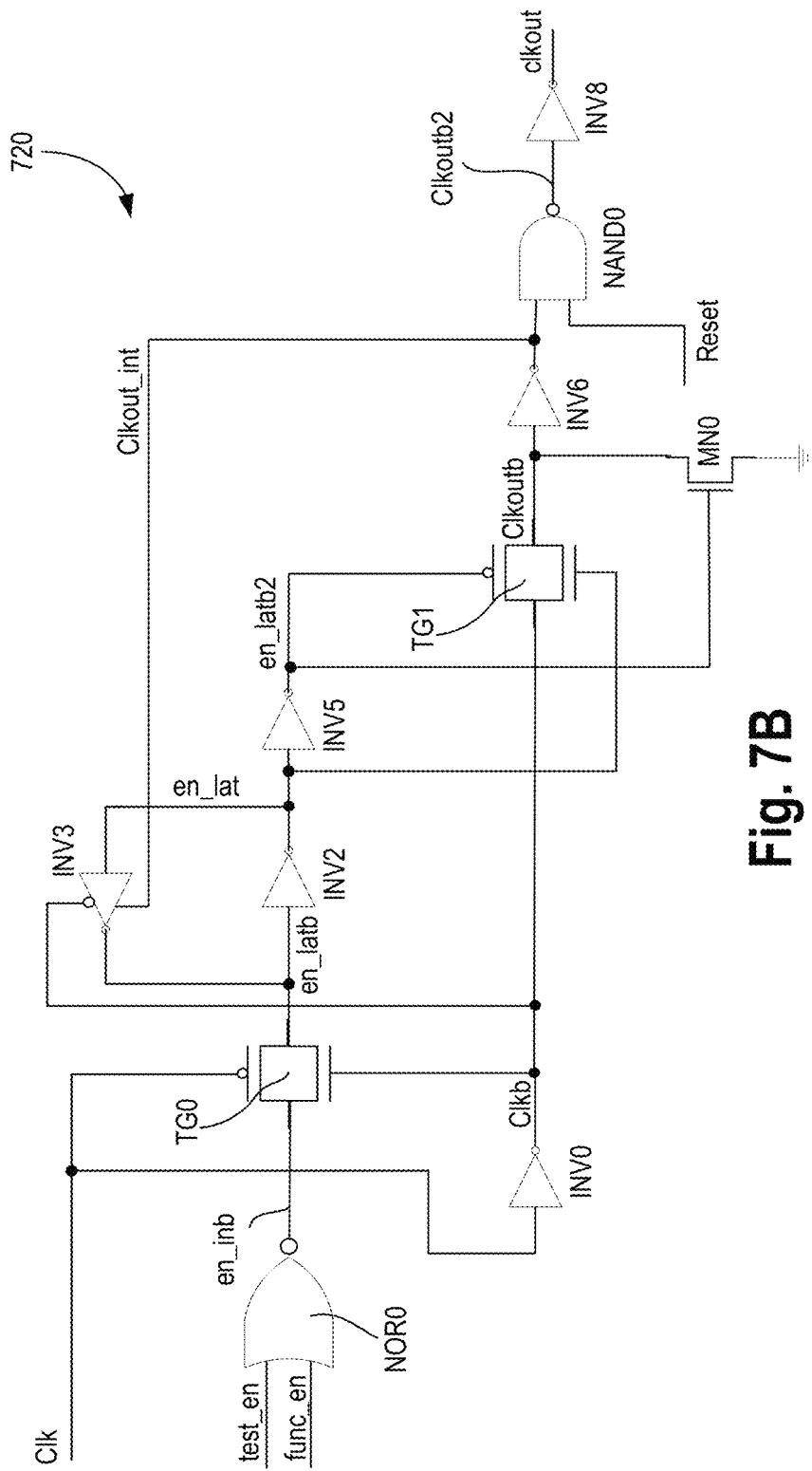
FIG. 7B illustrates a CGC (B09) with reset and n-type keeper, in accordance with some embodiments.

FIG. 7B illustrates CGC (B09) 700 with reset and with p-type keeper, in accordance with some embodiments. CGC (B09) 720 is similar to CGC (B09) 700, but for having an n-type keeper MN0. The gate terminal of transistor MN0 is controlled by en_latb2, which is the output of inverter INV5. Drain terminal of transistor MN0 is coupled to Clkoutb while the source terminal of transistor MN0 is coupled to ground. Technical or functional effect wise, CGC 720 behaves same as CGC 700.

FIG. 8A illustrates plot 800 that shows signal transition sequence when func_en is logic high, in accordance with some embodiments. FIG. 8B illustrates plot 820 that shows signal transition sequence when func_en is logic low, in accordance with some embodiments. To simplify description, the term enable is used as a proxy for func_en and test_en signals.

Scenario 1, Enable is high (logic 1): Node en_latb2 transitions low (logic 0) due to odd number of inversions in the path. Low transition on en_latb2 results in transmission gate TG1 to be transparent. Output signal clkout remains low since input signal clk is low as shown in plot 800.

Scenario 2: Enable is low (logic 0): Net en_latb2 transitions high (logic 1) due to odd number of inversions in the path. High transition on en_latb2 results in transmission gate TG1 to be non-transparent. Output signal clkout remains low since PMOS keeper MP0 holds clkoutb node at logic high ('1') value as showing in plot 820.

During high phase of clk, transmission gate TG0 is non-transparent. Circuit behavior is dependent on latched value of enable (en_lat) signal. There are two cases to be considered in this scenario: First when enable (en_lat) is high (logic 1): Transmission gate TG1 will be transparent. As a result, output signal clkout will be a delayed version of input signal clk. Second when enable (en_lat) is low (logic 0): Transmission gate TG1 will be non-transparent. Output signal clkout remains low since PMOS keeper MP0 holds clkoutb node at a logic high ('1') value.

Table 1 illustrates power performance and area (PPA) comparison of various CGC.

TABLE 1

| Parameter | Integrated clock gate, buffered clock | Integrated clock gate, unbuffered clock | CGC 300 |
|---|---|---|---|
| Area (in PP) | 1.000 | 0.964 | 1.000 |
| clk pin cap (fF) | 1.000 | 1.563 | 0.727 |
| Leakage Power (uW) | 1.000 | 0.926 | 0.971 |
| clk pin power (fJ) | 1.000 | 0.886 | 0.795 |
| en pin power (fJ) | 1.000 | 1.000 | 1.000 |
| te pin power (fJ) | 1.000 | 1.021 | 1.000 |
| Delay (ps) | 1.000 | 0.984 | 1.690 |
| Slew (ps) | 1.000 | 0.964 | 0.945 |
| Setup (ps) | 1.000 | 1.522 | 1.057 |

It can be inferred from Table 1 that B09 CGC 300 has the lowest pin-cap and clock energy (enable=0) at almost iso-area. Enable set-up time of B09 CGC is 43% better compared to B05 CGC and marginally (e.g., approximately 6%) worse compared to B01 CGC. B09 CGC has also the lowest hold time when compared to B01 and B05 CGC. clk to clkout delay is approximately 1.7× higher in B09 cell due to addition of two inverters in the clock path. This delay is recovered at block level, since buffers/inverters are added post CGC to minimize loading of the input clk.

Figure 9:
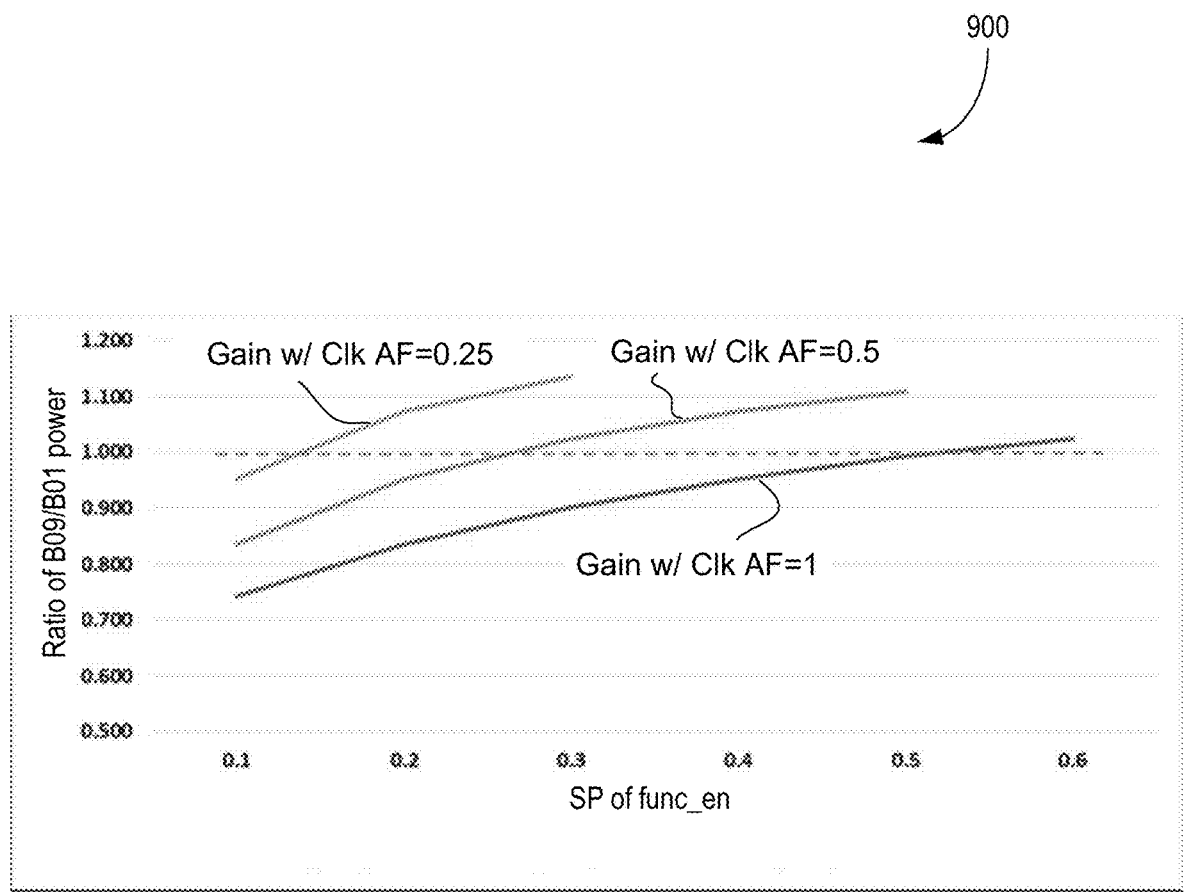
FIG. 9 illustrates a plot showing total power comparison of CGC B01 and CGC B09 at various activity factors, in accordance with some embodiments.

FIG. 9 illustrates plot 900 showing total power comparison of CGC B01 and CGC B09 at various activity factors, in accordance with some embodiments. In most of the common use-case scenarios, activity on input enable of most of the CGCs in a design is less than 10%. It is observed from plot 900 that at low Signal Probability (SP) levels of the input enable (e.g., approximately 10%), B09 implementation consumes significantly lower power compared to B01 at full toggle rate of input clock (AF=1). For example, when input clock toggle rate is "1" and SP of func_en is 0.1, B09 consumes 25% lower power than B01. However, in case of extremely low activity factor of the clock pin (e.g., less than 0.2), B09 consumes higher power than B01 implementation.

Figure 10:
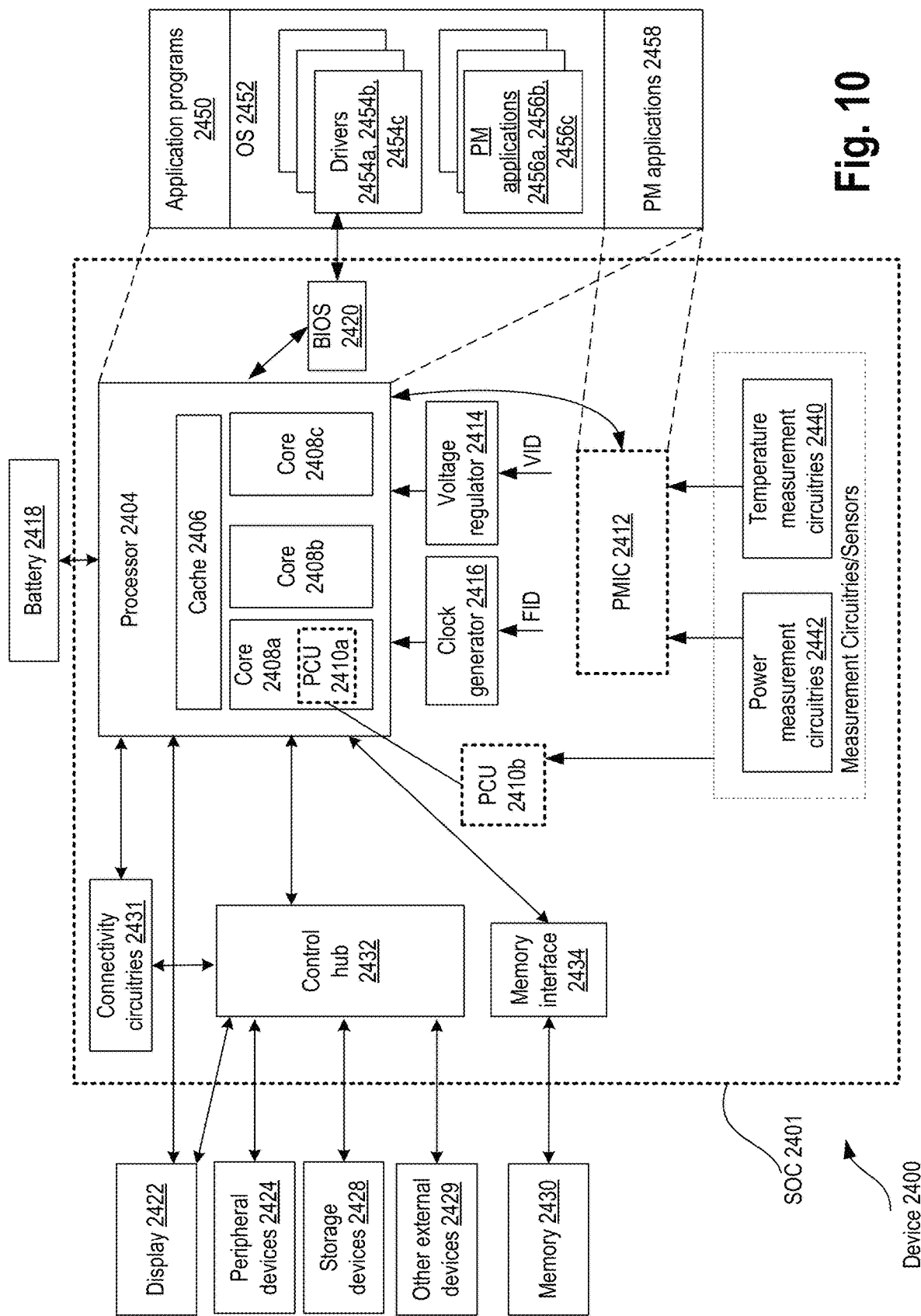
FIG. 10 illustrates a smart device, or a computer system, or a SoC (System-on-Chip) with low power CGCs, according to some embodiments of the disclosure.

FIG. 10 illustrates a smart device, or a computer system, or a SoC (System-on-Chip) with low power CGCs, according to some embodiments of the disclosure. Any block in the SoC discussed here can include the low power CGCs of various embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 15, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 15, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b*, and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first transmission gate to receive an input signal, wherein the first transmission gate is controllable by clock and a complementary of clock; a memory circuitry comprising a first inverter and a second inverter coupled in a ring, wherein the memory circuitry is coupled to the first transmission gate, wherein the second inverter is controllable by at least the complementary of the clock; a second transmission gate coupled to the first inverter and to receive the complementary of clock, wherein the second transmission gate is controllable by an output of the first inverter; a keeper device coupled to the second transmission gate, wherein the keeper device is controllable by the output of the first inverter; and a third inverter coupled to the keeper device and the second transmission gate, wherein and output of the third inverter is to control the second inverter.

Example 2: The apparatus of claim 1 comprises a fourth inverter coupled to the third inverter.

Example 3: The apparatus of claim 2 comprises a fifth inverter coupled to the fourth inverter.

Example 4: The apparatus of claim 1, wherein the keeper device comprises a p-type device.

Example 5: The apparatus of claim 1, wherein the keeper device is coupled to a power supply rail.

Example 6: The apparatus of claim 1 comprises a NOR gate to generate the input signal.

Example 7: The apparatus of claim 1 comprises a NAND gate coupled to the third inverter, wherein the NAND gate is to receive a reset signal.

Example 8: The apparatus of claim 7 comprises an inverter coupled to an output of the NAND gate.

Example 9: The apparatus of claim 1 comprises a sixth inverter to receive the clock and to generate the complementary of the clock.

Example 10: The apparatus of claim 1 comprises a seventh inverter coupled the first inverter and the second inverter, wherein an output of the seventh inverter is coupled to the second transmission gate.

Example 11: An apparatus comprising: a memory circuitry comprising a first inverter and a second inverter coupled in a ring; a third inverter coupled to the first and second inverter; a transmission gate coupled to the third inverter, wherein the transmission gate is controllable by outputs of the first and third inverters; a keeper device coupled to the transmission gate, wherein the keeper device is controllable by the output of the first inverter; and a fourth inverter coupled to the keeper device and the transmission gate, wherein and output of the fourth inverter is to control the second inverter.

Example 12: The apparatus of claim 11, wherein the transmission gate is a first transmission gate, wherein the apparatus comprises a second transmission gate to receive an input signal, wherein the second transmission gate is controllable by clock and a complementary of clock.

Example 13: The apparatus of claim 12, wherein the memory circuitry is coupled to the second transmission gate.

Example 14: The apparatus of claim 12, wherein the second inverter is controllable by at least the complementary of clock.

Example 15: The apparatus of claim 12 comprises: a fifth inverter coupled to the fourth inverter; and a seventh inverter coupled to the fifth inverter.

Example 16: The apparatus of claim 12 comprises a NAND gate coupled to the fourth inverter, wherein the NAND gate is to receive a reset signal.

Example 17: A system comprising: a memory; a processor coupled to the memory, wherein the processor comprises a clock gate cell which comprises: a memory circuitry comprising a first inverter and a second inverter coupled in a ring; a third inverter coupled to the first and second inverter; a transmission gate coupled to the third inverter, wherein the transmission gate is controllable by an outputs of the first and third inverters; a keeper device coupled to the transmission gate, wherein the keeper device is controllable by the output of the first inverter; and a fourth inverter coupled to the keeper device and the transmission gate, wherein and output of the fourth inverter is to control the second inverter; and a wireless interface to allow the processor to communicate with another device.

Example 18: The system of claim 11, wherein: the transmission gate is a first transmission gate, wherein the apparatus comprises a second transmission gate to receive an input signal, wherein the second transmission gate is controllable by clock and a complementary of clock; the memory circuitry is coupled to the second transmission gate; and the second inverter is controllable by at least the complementary of clock.

Example 19: The apparatus of claim 18 comprises: a fifth inverter coupled to the fourth inverter; and a seventh inverter coupled to the fifth inverter.

Example 20: The apparatus of claim 18 comprises a NAND gate coupled to the fourth inverter, wherein the NAND gate is to receive a reset signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first transmission gate to receive an input signal, wherein the first transmission gate is controllable by clock and a complementary of clock;
   a memory circuitry comprising a first inverter and a second inverter coupled in a ring, wherein the memory circuitry is coupled to the first transmission gate, wherein the second inverter is controllable by at least the complementary of the clock;
   a second transmission gate coupled to the first inverter and to receive the complementary of clock, wherein the second transmission gate is controllable by an output of the first inverter;
   a keeper device coupled to the second transmission gate, wherein the keeper device is controllable by the output of the first inverter; and
   a third inverter coupled to the keeper device and the second transmission gate, wherein and output of the third inverter is to control the second inverter.

2. The apparatus of claim 1 comprises a fourth inverter coupled to the third inverter.

3. The apparatus of claim 2 comprises a fifth inverter coupled to the fourth inverter.

4. The apparatus of claim 1, wherein the keeper device comprises a p-type device.

5. The apparatus of claim 1, wherein the keeper device is coupled to a power supply rail.

6. The apparatus of claim 1 comprises a NOR gate to generate the input signal.

7. The apparatus of claim 1 comprises a NAND gate coupled to the third inverter, wherein the NAND gate is to receive a reset signal.

8. The apparatus of claim 7 comprises an inverter coupled to an output of the NAND gate.

9. The apparatus of claim 1 comprises a sixth inverter to receive the clock and to generate the complementary of the clock.

10. The apparatus of claim 1 comprises a seventh inverter coupled the first inverter and the second inverter, wherein an output of the seventh inverter is coupled to the second transmission gate.

11. An apparatus comprising:
    a memory circuitry comprising a first inverter and a second inverter coupled in a ring;
    a third inverter coupled to the first and second inverter;

a transmission gate coupled to the third inverter, wherein the transmission gate is controllable by outputs of the first and third inverters;
a keeper device coupled to the transmission gate, wherein the keeper device is controllable by the output of the first inverter; and
a fourth inverter coupled to the keeper device and the transmission gate, wherein and output of the fourth inverter is to control the second inverter.

12. The apparatus of claim 11, wherein the transmission gate is a first transmission gate, wherein the apparatus comprises a second transmission gate to receive an input signal, and wherein the second transmission gate is controllable by clock and a complementary of clock.

13. The apparatus of claim 12, wherein the memory circuitry is coupled to the second transmission gate.

14. The apparatus of claim 12, wherein the second inverter is controllable by at least the complementary of clock.

15. The apparatus of claim 12 comprises:
a fifth inverter coupled to the fourth inverter; and
a seventh inverter coupled to the fifth inverter.

16. The apparatus of claim 12 comprises a NAND gate coupled to the fourth inverter, wherein the NAND gate is to receive a reset signal.

17. A system comprising:
a memory;
a processor coupled to the memory, wherein the processor comprises a clock gate cell which comprises:
a memory circuitry comprising a first inverter and a second inverter coupled in a ring;
a third inverter coupled to the first and second inverter;
a transmission gate coupled to the third inverter, wherein the transmission gate is controllable by an output of the first and third inverters;
a keeper device coupled to the transmission gate, wherein the keeper device is controllable by the output of the first inverter; and
a fourth inverter coupled to the keeper device and the transmission gate, wherein and output of the fourth inverter is to control the second inverter; and
a wireless interface to allow the processor to communicate with another device.

18. The system of claim 17, wherein:
the transmission gate is a first transmission gate, wherein the apparatus comprises a second transmission gate to receive an input signal, wherein the second transmission gate is controllable by clock and a complementary of clock;
the memory circuitry is coupled to the second transmission gate; and
the second inverter is controllable by at least the complementary of clock.

19. The system of claim 18 comprises:
a fifth inverter coupled to the fourth inverter; and
a seventh inverter coupled to the fifth inverter.

20. The system of claim 18 comprises a NAND gate coupled to the fourth inverter, wherein the NAND gate is to receive a reset signal.

* * * * *